United States Patent
Shen et al.

[11] Patent Number: 6,136,660
[45] Date of Patent: Oct. 24, 2000

[54] STACKED CAPACITOR MEMORY CELL AND METHOD OF FABRICATION

[75] Inventors: Hua Shen, Beacon; Gerhard Kunkel, Fishkill, both of N.Y.; Martin Gutsche, Dorfen, Germany

[73] Assignee: Siemens Aktiengesellschaft, Munich, Germany

[21] Appl. No.: 09/161,861

[22] Filed: Sep. 28, 1998

[51] Int. Cl.[7] ................................................. H01L 21/20
[52] U.S. Cl. ............................................. 438/386; 438/386
[58] Field of Search .................................... 438/253, 255, 438/256, 329, 396, 399, 210, 240, 241, 3, 238, 239, 393; 257/306, 310

[56] References Cited

U.S. PATENT DOCUMENTS

| | | | |
|---|---|---|---|
| 5,607,874 | 3/1997 | Wang et al. | 437/52 |
| 5,672,534 | 9/1997 | Huang | 437/52 |
| 5,702,989 | 12/1997 | Wang et al. | 438/397 |
| 5,714,401 | 2/1998 | Kim et al. | 437/52 |
| 5,716,884 | 2/1998 | Hsue et al. | 438/254 |
| 5,721,152 | 2/1998 | Jenq et al. | 437/52 |
| 5,750,431 | 5/1998 | Wu | 438/254 |
| 5,879,957 | 3/1999 | Joo | 438/420 |
| 5,940,676 | 8/1999 | Fazan et al. | 438/393 |

*Primary Examiner*—David Nelms
*Assistant Examiner*—Dung A Le
*Attorney, Agent, or Firm*—Donald B. Paschburg

[57] ABSTRACT

A memory cell includes a field effect transistor and a stacked capacitor. The stacked capacitor has one plate formed by a platinum layer over the side walls of a portion of a dielectric layer that overlies a conductive layer that makes contact to a conductive plug connected to the storage node of the cell. The capacitor dielectric overlies the sidewalls and top of the dielectric layer portion and the other plate of the capacitor is formed by a platinum layer over the capacitor dielectric.

7 Claims, 4 Drawing Sheets

STACKED CAPACITOR MEMORY CELL AND METHOD OF FABRICATION

FIELD OF INVENTION

This invention relates to a dynamic random access memory (DRAM), and more particularly, to a memory cell for use in a DRAM that includes a field effect transistor and a stacked capacitor and to a method of fabrication.

BACKGROUND OF THE INVENTION

One of the most important integrated circuits is the DRAM. A typical DRAM comprises a very large array of memory cells arranged in rows and columns, each of which is adapted to store a binary digit (bit) that can be controllably read in and out of the cell. To store the bit between write and read operations, each memory cell generally includes a capacitor in series with a switch, generally a MOS transistor. To provide a large array of memory cells in a single silicon chip, it is important to use memory cells that are use little silicon area and that can be closely packed. Since the switching transistor necessarily must be located in the silicon wafer, one form of memory cells achieve a space saving by forming the storage capacitor over the top surface, rather than in the interior, of the silicon chip. A capacitor so formed is usually described as a stacked capacitor since it is generally formed by a multilayer stack on the top surface of the silicon chip.

Because of the small size and high density of such capacitors on the top surface of the chip, the process for forming them is demanding. The present invention provide an improved process for forming such stacked capacitors.

SUMMARY OF THE INVENTION

The present invention is directed to a memory cell comprising a transistor and a stacked capacitor and a method of fabrication of same.

The memory cell is fabricated as follows:

First there is prepared a silicon chip in which there are formed on a top surface thereof field effect transistor having drain and source regions. The source region is connected electrically to a lower plate of a stacked capacitor. It will be convenient to describe such current terminal as the drain. Generally, the top surface of the chip will have an overlying dielectric within which will be included, in addition to the stacked capacitor, various layers for providing the bit and word lines used for writing into and reading out of the memory cell.

To form the stacked capacitor, there is first made a contact hole in the dielectric coating aligned with the source that serves as the storage node of the memory cell. This hole advantageously is made by anisotropic etching so that the hole can have essentially vertical side walls.

After the hole is made, it is filled with a conductor to form a conductive plug, typically of highly doped polysilicon, that forms a low resistance connection to the transistor drain that serves as the storage node. To insure that the plug makes a good connection, it is advantageous to overfill the plug and then to planarize the surface, typically by chemical mechanical polishing (CMP).

Next it is advantageous, although it may be omitted, to cover the top surface of the plug with a diffusion barrier layer that will make a conductive connection both with the plug and with the metal layer, advantageously of platinum, that is to be deposited thereover later and that will be the first plate, or storage node, of the stacked capacitor. This diffusion barrier layer should be such as to serve as a barrier to any diffusion into the metal layer of any undesired material, such as polysilicon. It is especially important when such metal layer is of platinum that reacts undesirably with silicon. Suitable materials for the barrier layer include TiN, TaSiN, and TiAlN.

After the barrier layer is formed, it is covered with a dielectric layer. This dielectric layer is patterned photolithographically to leave a limited portion centered over the conductive plug in the original dielectric layer. The surface area of the sidewalls of this limited portion of the dielectric layer will largely determine the capacitance provided so the dimensions of this portion are chosen appropriately.

Then a metal, advantageously platinum, is deposited over the sidewalls of this limited portion. Optionally, it may be made also to cover the top surface. It will serve as the lower plate of the capacitor.

Now the barrier layer is etched so that it conforms. Next a layer of a material suitable for use as the dielectric of the stacked capacitor is formed conformally over platinum layer.

Finally the capacitor is completed by depositing a second metallic layer, advantageously also of platinum, over the capacitor dielectric. This will form the second (upper) plate of the capacitor, the plate that is normally maintained at a fixed potential, typically ground.

Viewed from an apparatus aspect, the present invention is directed to a memory cell. The memory cell comprises a semiconductor body which has at a portion of a top surface thereof first and second regions of one conductivity type spaced apart by an intermediate region of opposite conductivity type to form a transistor, and a capacitor.

The capacitor is formed over the first region and comprises a conductive plug making electrical contact with said first region; a layer of a conductor forming a diffusion barrier overlying said plug; a portion of a dielectric layer overlying said barrier layer and positioned over said plug; a first metallic layer on at least the sidewalls of said dielectric layer and in electrical contact with the barrier layer for serving as the inner plate of the capacitor; a layer of a dielectric material conformally surrounding the top and side wall surfaces of said dielectric layer portion for serving as the capacitor dielectric; and a second metallic layer conformally overlying said last-mentioned layer of dielectric material for serving as the outer plate of the capacitor.

Viewed from a process aspect, the present invention is directed to a method of forming a memory cell. The method comprises the steps of: forming spaced apart source and drain regions of a transistor at a top surface of a silicon body; forming a dielectric coating over the top surface of the silicon body; forming a contact hole with essentially vertical side walls in a portion of the dielectric coating overlying the spaced region that is to serve as the storage node of the cell; filling the contact hole with a conductor to form a conductive plug to said last-mentioned spaced region; forming a conductive barrier layer over the conductive plug; forming a dielectric layer portion over the conductive barrier layer; forming a conductive layer over at least the sidewalls of the dielectric layer portion for serving as the inner plate of a storage capacitor; forming a dielectric layer over said last mentioned conductive layer and top of the dielectric layer portion suitable for use as the dielectric layer of the storage capacitor; and forming a conductive layer over the dielectric capacitor layer for serving as the outer plate of the storage capacitor.

The invention will be better understood from the following more detailed description taken in conjunction with the accompanying drawing.

Figure 1:
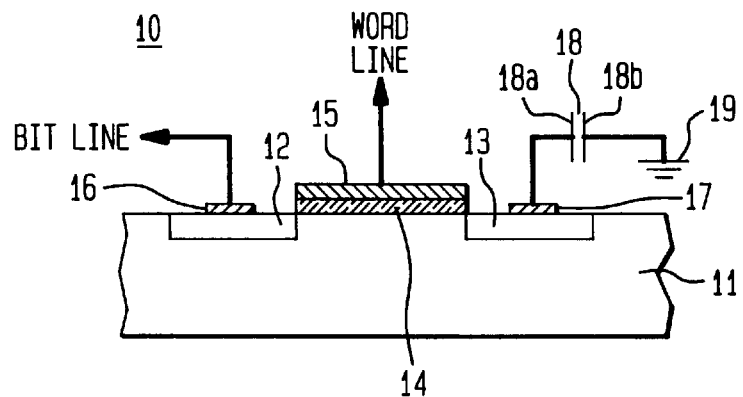
FIG. 1 shows in circuit schematic and semiconductor cross section a memory cell of a typical prior art DRAM.

It is to be noted that the drawings are not necessarily to scale.

DETAILED DESCRIPTION OF THE DRAWING

FIG. 1 shows a typical prior art memory cell 10 used in many of todays DRAMS. Memory cell 10 is shown in circuit schematic form with a semiconductor device shown in cross section. The cell comprises a capacitor 18 having first and second plates 18a and 18b, and a insulated gated field effect transistor (IGFET) that is also known as a metal-oxide-semiconductor field effect transistor (MOSFET). The IGFET is formed in a semiconductor body (substrate) 11 and comprises a drain region 12 and a source region 13 separated by a portion of substrate 11. Overlying the portion of the substrate 11 which separates regions 12 and 13 is a dielectric layer 14 that is denoted as a gate oxide. Overlying layer 14 is a gate conductor 15 that is coupled to a word line of the DRAM. Overlying at least a portion of the drain is a contact 16 that is coupled to a bit line of the DRAM. Overlying at least a portion of region 13 is a contact 17 that is coupled to plate 18a of capacitor 18. Plate 18b of capacitor 18 is typically coupled to a fixed potential, shown as ground 19. Region 12, that has been denoted as the drain becomes the source during portions of the operation of memory cell 10. Region 13 that has been denoted as the source, becomes the drain during portions of the operation of memory cell 10. Typically substrate 11 is silicon of n-type conductivity and regions 12 and 13 are of p-type conductivity. For an n-channel transistor substrate 11 is of p-type conductivity with regions 12 and 13 of n-type conductivity. By the application of signals to the bit and word lines, binary digits are written into and read out of the capacitor 18.

Figure 2:
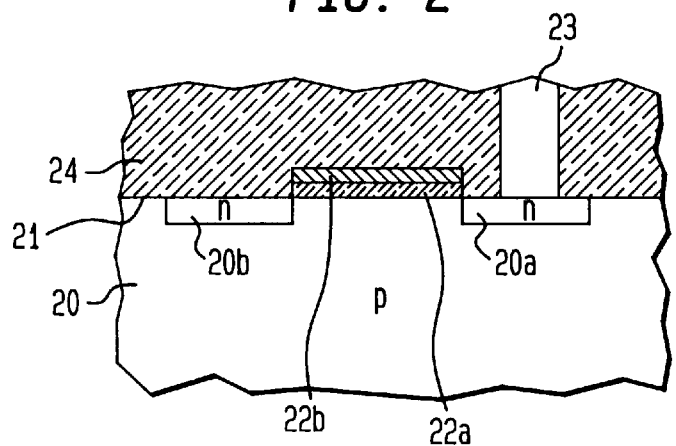
FIG. 2 shows a memory chip that includes a stacked capacitor shown schematically on its top surface.

FIG. 2 shows a cross section of a p-type portion of a silicon body (substrate) 20 large enough to accommodate one memory cell in accordance with the present invention. In a top surface 21 of substrate 20 are formed two n-type regions 20a and 20b that are separated by a portion of substrate 20 and form the drain and source of the transistor. A dielectric layer 22a, a gate oxide, overlies the portion of the substrate 20 between regions 20a and 20b and a gate 22b overlies layer 22a. The top surface 21 is shown covered with a layer 24 largely of dielectric material, typically a combination of silicon oxide and silicon nitride layers, in which are included various conductive layers (not shown) that serve as the bit and word lines and contact plugs (not shown) that connect the transistor terminals to such lines.

A capacitor, denoted as a stacked capacitor, will be formed in a trench 23 that extends through layer 24 down to region 20a.

Figure 3:
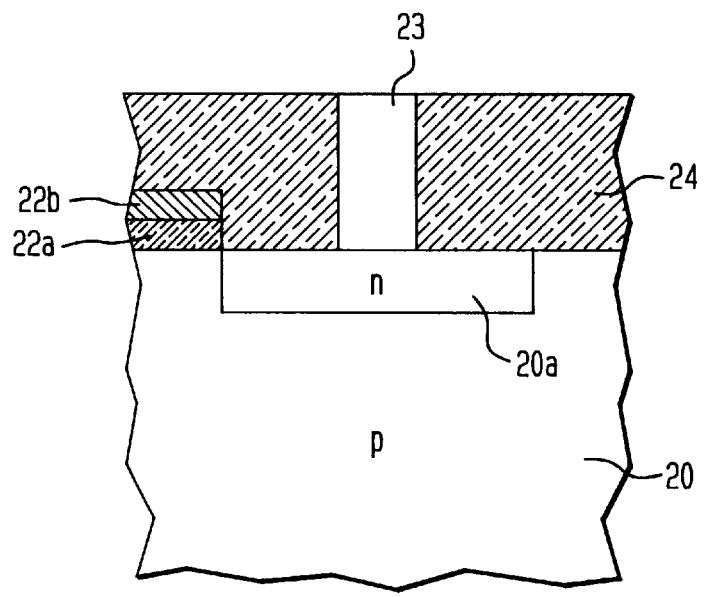
FIGS. 3–9 illustrate the preparation of a stacked capacitor in accordance with the present invention for use with the memory cell of FIG. 2.

FIG. 3 shows the portion of the structure of FIG. 2 that includes region 20a, layer 24, and contact hole 23. To form the stacked capacitor of the present invention, there is first formed a contact hole 23, in the dielectric layer 24 to expose a portion of region 20a of the substrate 20. This contact hole advantageously has vertical side walls that are typically formed by reactive ion etching (RIE) that etches anisotropically under the control of a mask formed by known photolithographic patterning techniques.

In subsequent figures, there is shown only the portion of dielectric layer 24 in which there is being formed the stacked capacitor that makes low resistance connection to the n-type regions 20a of the transistor.

Figure 4:
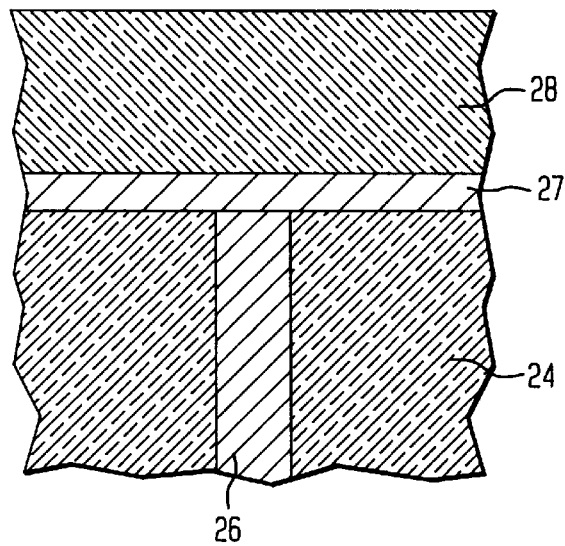

As seen in FIG. 4, this contact hole has been filled with conductive material, typically n-type doped polysilicon, to form a low resistance conductive contact plug 26 to underlying region 20a of the substrate 20. Typically to insure fill, enough polysilicon is deposited, typically by chemical vapor deposition (CVD) to cover the surface of the dielectric layer 24 and the surface is then planarized by chemical mechanical polishing (CMP) in known fashion essentially to leave only the fill.

Then also as shown in FIG. 4, the region surrounding the contact plug 26 advantageously is covered with a conductive barrier layer 27, typically of a conductive material, such as TaSiN, that can serve to limit the outdiffusion of the n-type dopant or the migration of silicon from the polysilicon fill. It need be no thicker than is enough to be an effective barrier. This barrier layer is then covered with a dielectric layer 28, typically of either silicon oxide, silicon nitride, or silicon oxynitride.

Figure 5:
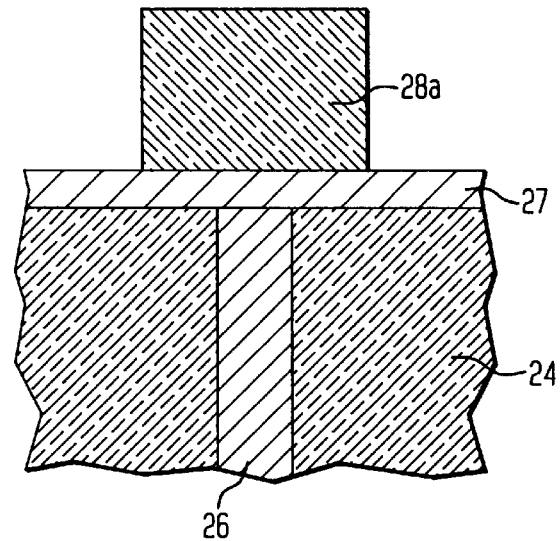

Then as is shown in FIG. 5, this dielectric layer 28 is trimmed to layer 28a, essentially centered over the contact plug 26, and generally of larger cross section than the plug, since the surface area of its side walls will essentially be the surface area of the plates of the capacitor.

Figure 6:
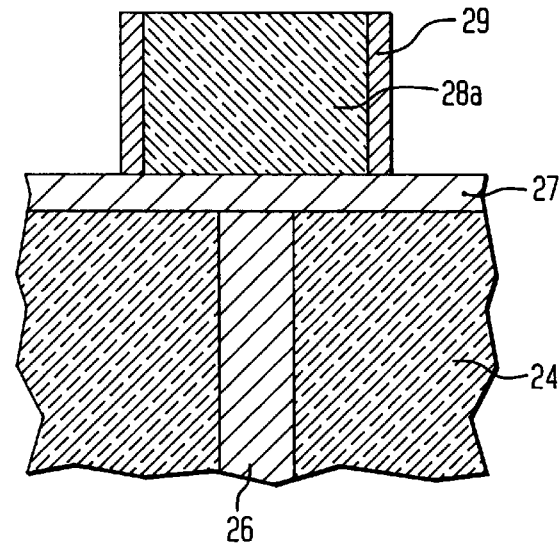
Figure 9:
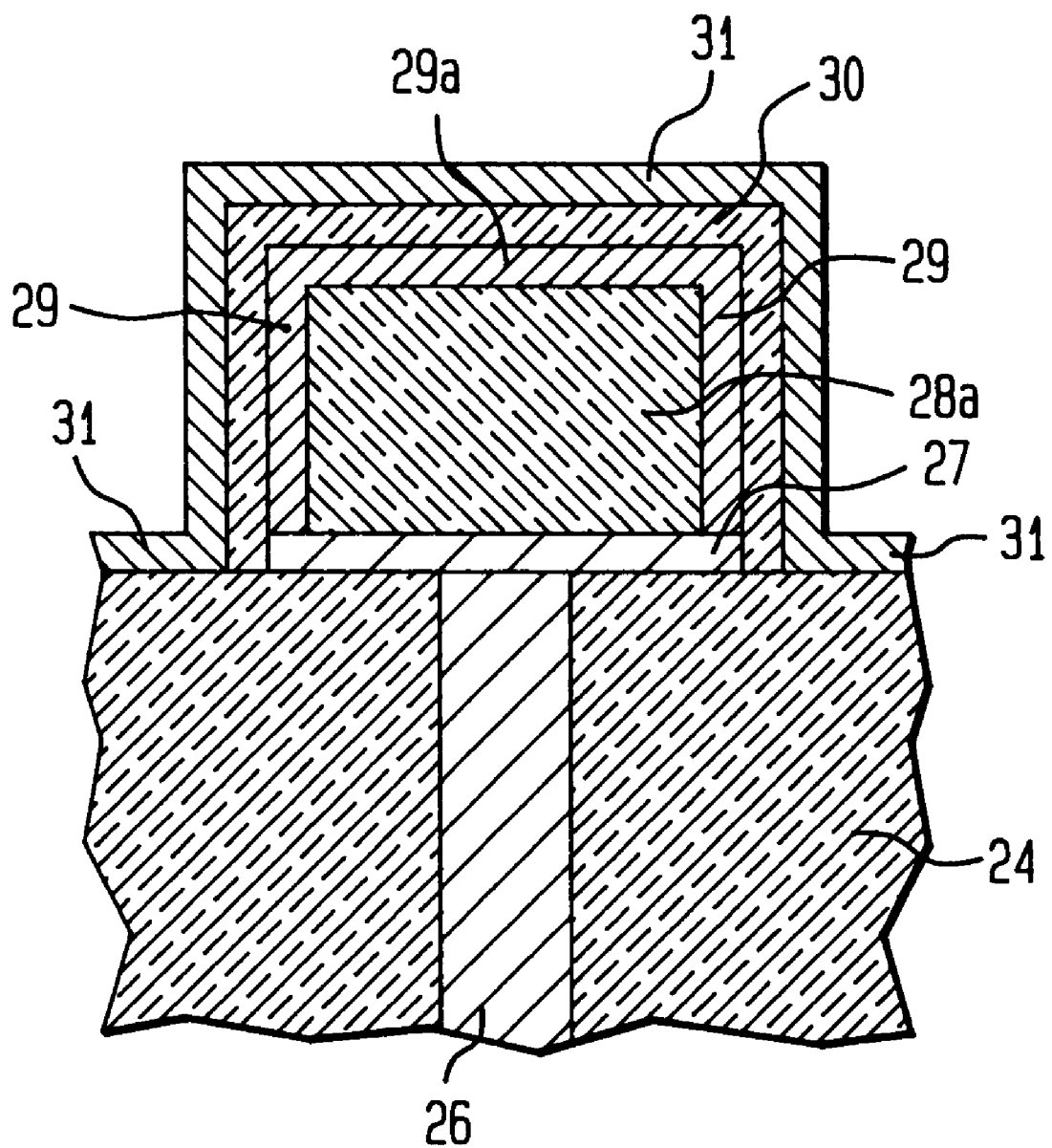

Then a layer 29 of a metal, advantageously platinum, is formed at least on the side walls of the dielectric layer 28a, as is shown in FIG. 6. Optimally, it can be deposited also to cover the top surface of dielectric layer 28A as is shown in FIG. 9 that is discussed below. If it is desired to confine the layer 29 only to the side walls, it is usually advantageous to deposit the platinum uniformly over all exposed surfaces of the layer 28a, and then to remove the platinum in known fashion, as by ion milling, where it is not desired. There is then also removed the exposed remains of the barrier layer 27 to leave the structure shown in FIG. 7. The platinum layer 29 remaining on the side walls of the layer 28a will serve as the lower plate of the capacitor that will be connected to a current terminal of the switching transistor, as shown in FIG. 1.

Figure 8:
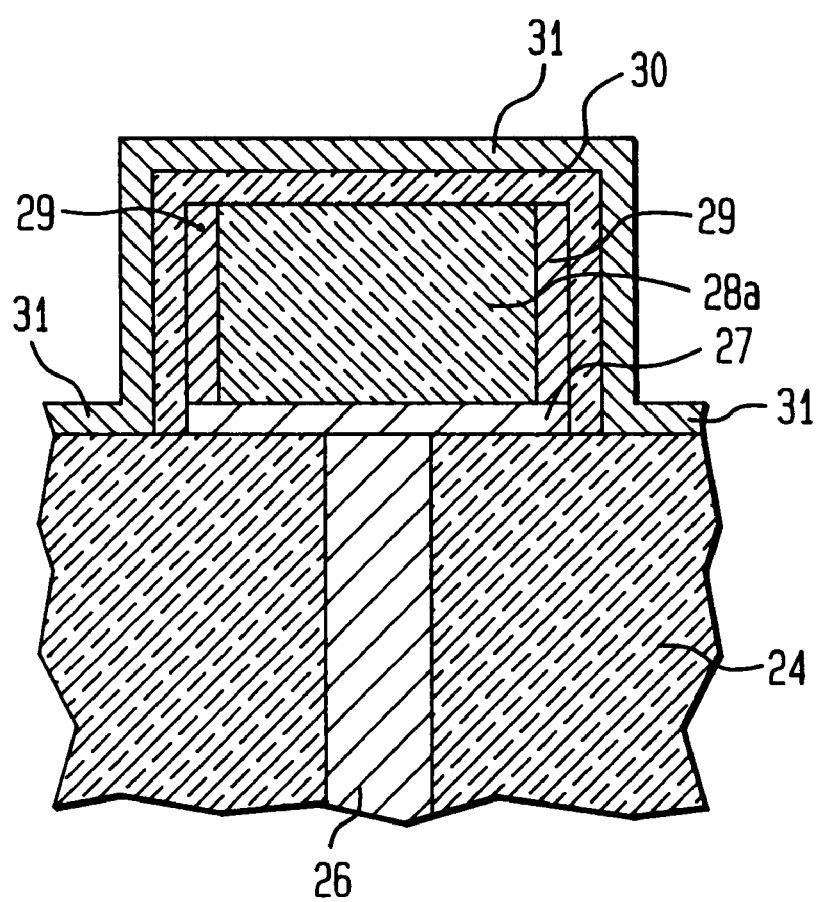

Next as is shown in FIG. 8, there are deposited in turn a dielectric layer 30 that will serve as the capacitor dielectric and a metallic layer 31 that will serve as the upper plate of the capacitor. The dielectric layer 30 should be of a material having a high dielectric constant, such as barium strontium titanate, to provide a desirably high capacitance for the storage capacitor. The metallic layer 31 should be of a good conductor, advantageously platinum. It is generally desirable to have a portion of the dielectric layer 30 that will serve as the capacitor dielectric extending sufficiently to protect against any misalignment of the capacitor portions with the contact plug. The outer layer 31 that serves as the outer plate of the capacitor generally will be extended over the surface of the chip to serve a similar role in other cells of the array.

In an illustrative embodiment the height of the stacked capacitor above a top surface of contact plug 26 is about 0.25 micron, the thickness of layer 27 is in the range of about 200 to 500 Angstroms, the width of dielectric layer 28a between the vertical side walls of layer 29 is about three feature sizes, and the depth of the layer 28a is about one feature size.

Figure 7:
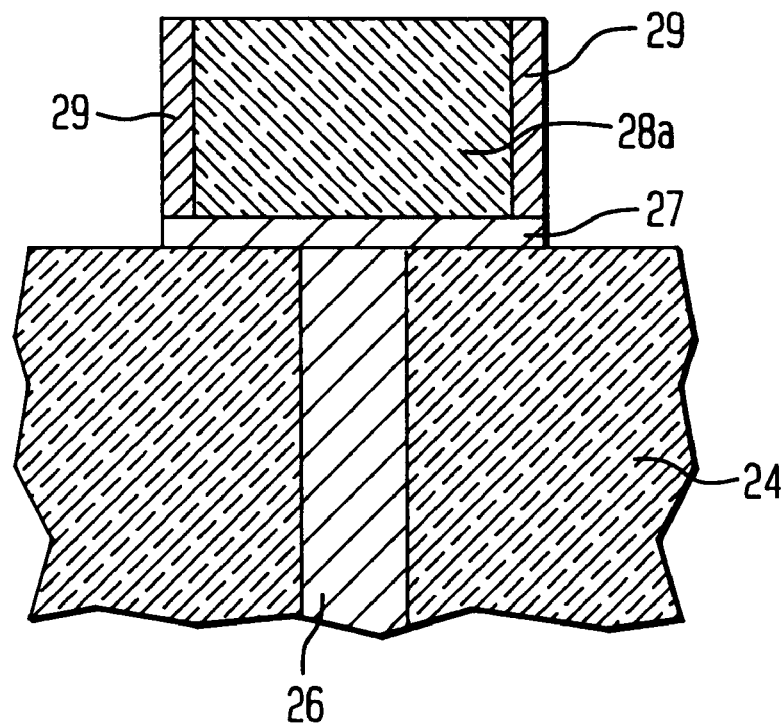

FIG. 9 shows an alternate embodiment of the invention which is very similar to the embodiment of FIG. 8 except that layer 29 of FIG. 7 is extended as layer 29a over the top of layer 28a. This extension 29a of layer 29 increases the capacitance of the stacked capacitor.

Since the metallic layer 31 typically will be operated at ground potential, other layers to be operated at ground may be connected thereto.

It is to be understood that the embodiment described is merely illustrative of the invention. Various modifications can be made to it without departing from the spirit and scope of the invention. For example, a layer of silicon nitride can be used between the layer 28*a*, typically of silicon oxide, and the layer 29, typically of platinum, to improve the adhesion of layers 28*a*, 29, and 29*a*. In addition, materials other than those mentioned may be substituted for those mentioned so long as such other materials have the characteristics critical for the particular role served. For example, instead of platinum, metals such as iridium, copper or gold may be used for forming the capacitor. Similarly other materials of high dielectric constant may be substituted for the barium strontium titanate. Additionally, the cross sectional shape of the contact plug and the layer 28*a*, each typically essentially rectangular, can be chosen as desired to facilitate manufacture.

What is claimed is:

1. A method of forming a memory cell comprising the steps of:

forming spaced apart source and drain regions of a transistor at a top surface of a silicon body;

forming a dielectric coating over the top surface of the silicon body;

forming a contact hole with essentially vertical side walls in a portion of the dielectric coating overlying one of the source and drain regions that is to serve as a storage node of the cell;

filling the contact hole with a conductor to form a conductive plug;

forming a conductive barrier layer over the conductive plug;

patterning a dielectric layer portion over the conductive barrier layer;

forming a first conductive layer over at least sidewalls of the dielectric layer portion, the first conductive layer forming vertically disposed conductive portions connecting to the conductive barrier layer, the first conductive layer serving as an inner plate of a storage capacitor;

forming a dielectric layer over the first conductive layer and top of the dielectric layer portion; and forming a second conductive layer over the dielectric layer for serving as an outer plate of the storage capacitor.

2. The method of claim 1, in which the first and second conductive layers are made from platinum.

3. The method of claim 1, in which the conductive barrier layer is of material chosen from a group consisting of TiN, TaSiN, and TiAlN.

4. The method of claim 1, in which the dielectric layer is made from barium strontium titanate.

5. The method of claim 1, further including the step of forming an extended portion of the first conductive layer, the extended portion being formed over the top of the dielectric layer portion.

6. The method of claim 5, wherein the dielectric layer is formed over the first conductive layer and the extended portion of the first conductive layer.

7. The method of claim 5, wherein the extended portion of the first conducive layer is made from platinum.

* * * * *